(12) United States Patent
Zhao et al.

(10) Patent No.: US 11,848,052 B2
(45) Date of Patent: Dec. 19, 2023

(54) TERNARY CONTENT ADDRESSABLE MEMORY BASED ON MEMORY DIODE

(71) Applicant: ZHEJIANG UNIVERSITY, Zhejiang (CN)

(72) Inventors: Yi Zhao, Hangzhou (CN); Bing Chen, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 39 days.

(21) Appl. No.: 17/704,041

(22) Filed: Mar. 25, 2022

(65) Prior Publication Data

US 2022/0215882 A1 Jul. 7, 2022

Related U.S. Application Data

(62) Division of application No. 17/049,585, filed as application No. PCT/CN2018/095745 on Jul. 16, 2018, now Pat. No. 11,328,774.

(30) Foreign Application Priority Data

May 14, 2018 (CN) .......................... 201810458536.6

(51) Int. Cl.
*G11C 13/00* (2006.01)
*G11C 15/04* (2006.01)
*H10N 70/20* (2023.01)

(52) U.S. Cl.
CPC ........... *G11C 15/046* (2013.01); *H10N 70/20* (2023.02)

(58) Field of Classification Search
CPC .................................................. G11C 15/046
See application file for complete search history.

(56) References Cited

U.S. PATENT DOCUMENTS 7,450,416 B1 11/2008 Kaza et al.
9,847,132 B1 12/2017 Zheng et al.
(Continued)

FOREIGN PATENT DOCUMENTS

CN 104752608 A 7/2015
CN 106206944 A 12/2016
(Continued)

OTHER PUBLICATIONS

International Search Report (PCT/CN2018/095745); dated Feb. 3, 2019.
JP First Office Action(2019-538661); dated Jun. 29, 2020.

*Primary Examiner* — Min Huang
(74) *Attorney, Agent, or Firm* — W&G Law Group

(57) ABSTRACT

The present disclosure discloses a ternary content addressable memory based on a memory diode, which includes a plurality of kernel units having functions of storing data, erasing/writing data, and comparing data; the kernel units are arranged in an array, all kernel units in a unit of row are connected to a same matching line, and all kernel units in a unit of column are connected to a same pair of complementary search signal lines; the kernel unit includes two memory diodes; top electrodes of a first memory diode and a second memory diode are respectively connected to a pair of complementary search signal lines, and bottom electrodes of the first memory diode and the second memory diode are connected to a same matching line. The present disclosure can greatly reduce a chip dimension of the ternary content addressable memory and reduce power consumption; the ternary content addressable memory of the present disclosure has a simple structure, which effectively simplifies a manufacturing process and reduces a manufacturing cost; the present disclosure provides and achieves a memory diode that is compatible with a standard CMOS process, (Continued)

which is suitable for currently rapidly developing semiconductor integrated circuits.

7 Claims, 3 Drawing Sheets

(56) References Cited

U.S. PATENT DOCUMENTS

2015/0372228 A1* 12/2015 Chiang ................ H01L 45/146
　　　　　　　　　　　　　　　　　　　　　　　　　　　257/2
2019/0304987 A1* 10/2019 Dong .................... H01L 29/788

FOREIGN PATENT DOCUMENTS

| CN | 106654009 A | 5/2017 |
| CN | 107945830 A | 4/2018 |
| JP | 2008525935 A | 7/2008 |
| JP | 201215211 A | 1/2012 |
| JP | 2014116495 A | 6/2014 |
| JP | 2017534169 A | 11/2017 |

* cited by examiner

| $V_{MLx}$ data stored on $ML_x$ search signal | $ML_0$ | $ML_1$ | $ML_2$ | $ML_3$ | $ML_4$ | $ML_5$ | $ML_6$ | $ML_7$ |
|---|---|---|---|---|---|---|---|---|
| | FF | 00 | A5 | 5A | 55 | A0 | FA | 99 |
| FF | 0.28 | 0.99 | 0.88 | 0.72 | 0.98 | 0.89 | 0.86 | 0.87 |

TERNARY CONTENT ADDRESSABLE MEMORY BASED ON MEMORY DIODE

CROSS-REFERENCE TO RELATED APPLICATION

This application is a divisional application of U.S. application Ser. No. 17/049,585, filed on Oct. 22, 2020, which is a national phase of International Application No. PCT/CN2018/095745, filed on Jul. 16, 2018, and claims priority to Chinese Patent Application No. 201810458536.6, filed on May 14, 2018. All of the aforementioned applications are hereby incorporated by reference in their entireties.

TECHNICAL FIELD

The present disclosure relates to the field of semiconductors and integrated circuits, and more particularly, to a ternary content addressable memory based on a memory diode and having a high density and low power consumption.

BACKGROUND

A ternary content addressable memory (TCAM) has a function of parallelly searching for multiple data and has a wide range of applications, such as parameter curve extraction, Hough transformation, Huffman coding/decoding and so on, and a main commercial usage is to classify and forward IP data packets in network routers.

Currently in designing of the TCAM, a biggest concern is a chip dimension and power consumption. Although currently non-volatile content memory units based on a magnetic memory (MRAM) and a phase change memory (PCM) have been implemented, their structures are complicated, and a manufacturing process cannot be completely compatible with a standard CMOS process.

SUMMARY

In view of defects in the existing ternary content addressable memory, an object of the present disclosure is to provide a ternary content addressable memory based on a memory diode, which can reduce a chip dimension and power consumption and be well compatible with the standard CMOS process.

The object of the present disclosure is achieved by following technical solutions. The present disclosure provides a memory diode, including a bottom electrode, an isolation layer, a memory layer, and a top electrode that are stacked from bottom to top. The memory layer is formed by stacking germanium oxide, aluminum oxide, and hafnium oxide from bottom to top, and the bottom electrode is made of germanium. A material of the isolation layer includes, but not limited to, silicon oxide. The top electrode may be formed by stacking titanium nitride and metallic nickel.

Furthermore, in an operation state of the memory diode, a bottom electrode of the memory diode is connected to ground, and a corresponding voltage is applied to a top electrode of the memory diode, so as to achieve transition between an off-state and an on-state of the memory diode.

Furthermore, resistance of the memory diode in the off-state suddenly decreases after being applied with a negative voltage, this process is referred to as SET, the memory diode changes from the off-state to the on-state and is regarded as a diode device; and the resistance of the memory diode in the on-state suddenly increases after being applied with a positive voltage, this process is referred to as RESET, the memory diode changes from the on-state to the off-state and is regarded as a resistor having high resistance.

The present disclosure provides a ternary content addressable memory based on a memory diode, and the ternary content addressable memory includes a number of kernel units having functions of data storing, data erasing/writing, and data comparing. The kernel units are arranged in an array, all kernel units in a unit of row are connected to a same matching line, and all kernel units in a unit of column are connected to a same pair of complementary search signal lines. Each of the kernel units includes a first memory diode and a second memory diode. Top electrodes of the first memory diode and the second memory diode are respectively connected to a pair of complementary search signal lines, and bottom electrodes of the first memory diode and the second memory diode are connected to a same matching line.

Furthermore, the matching line is made of germanium, for generating a voltage signal after comparison of the search signal with the stored data; and the search signal line is a metal line connected to the top electrode of the diode, for inputting the search signal and a signal erasing/writing the data stored in the memory diode.

Furthermore, the first memory diode and the second memory diode in the kernel unit cooperate with each other to store three logic states of [0], [1], and [don't care]: when the first memory diode is in an on-state and the second memory diode is in an off-state, the kernel unit stores a data bit [0]; when the first memory diode is in the off-state and the second memory diode is in the on-state, the kernel unit stores a data bit [1]; and when both the first memory diode and the second memory diode are in the off-state, the kernel unit is in a state of [don't care].

Furthermore, when a data bit stored in the kernel unit is consistent with a search signal, it is in a match state (match), and when all kernel units on a same matching line are in the match state (match), the matching line outputs [0]; when a data bit stored in the kernel unit is inconsistent with the search signal, it is in a mismatch state (mismatch), and when one or more kernel units on a same matching line are in the mismatch state (mismatch), the matching line outputs [1].

Beneficial technical effects of the present disclosure are as follows. First, the present disclosure can greatly reduce the chip dimension of the ternary content addressable memory. Second, the present disclosure can reduce the power consumption. Third, the present disclosure has a simple structure, which effectively simplifies the manufacturing process and reduces the manufacturing cost. Fourth, the present disclosure has good compatibility with the standard CMOS process and is suitable for currently rapidly developing semiconductor integrated circuits.

DESCRIPTION OF EMBODIMENTS

Some of many possible embodiments of the present disclosure are described in the following, which are intended to provide basic understanding of the present disclosure, and not intended to confirm key or decisive elements of the present disclosure or to limit the protection scope. It is easy to understand that, according to the technical solution of the present disclosure, without changing the essential spirit of the present disclosure, those skilled in the art can propose other implementation manners that can be replaced with each other. Therefore, the following specific embodiments and drawings are merely exemplary descriptions of the technical solutions of the present disclosure and should not be regarded as all of the present disclosure or definition or limitation of the technical solutions of the present disclosure.

Figure 1:
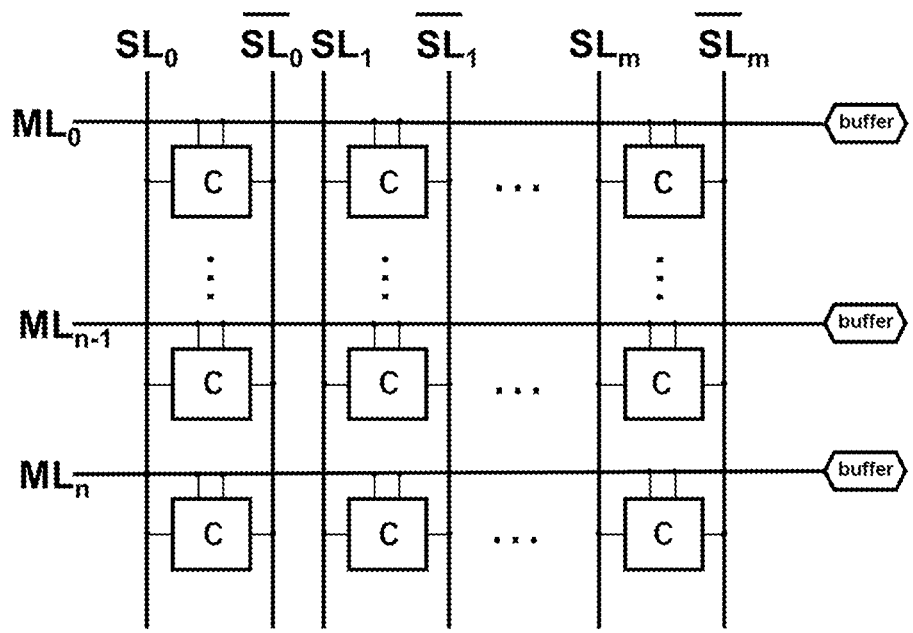
FIG. 1 is a structural schematic diagram of a ternary content addressable memory based on a memory diode according to the present disclosure.

FIG. 1 is a structural schematic diagram of a ternary content addressable memory based on a memory diode according to the present disclosure. The ternary content addressable memory includes a plurality of kernel units (C) having functions of data storing, data erasing/writing, and data comparing; the kernel units (C) are arranged in an array, all kernel units in a unit of row are connected to a same matching line (ML), and all kernel units in a unit of column are connected to a same pair of complementary search signal lines (SL/$\overline{SL}$); a total of m bits are stored on a same matching line (ML), and each search signal contains m bits. The n matching lines indicate that this ternary content addressable memory stores a total of n words.

Figure 2:
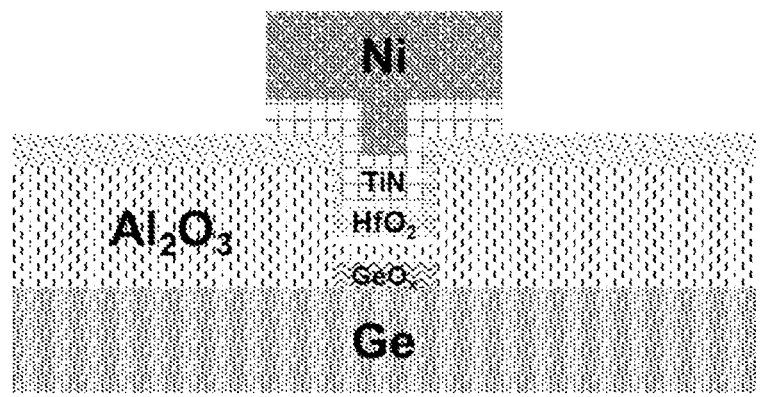
FIG. 2 is a structural schematic diagram of a memory diode according to the present disclosure.

FIG. 2 is a structural schematic diagram of a memory diode according to the present disclosure. The memory diode includes a bottom electrode, an isolation layer, a memory layer, and a top electrode that are stacked from bottom to top; the memory layer is formed by stacking germanium oxide, aluminum oxide, and hafnium oxide from bottom to top; a material of the bottom electrode is germanium. A material of the isolation layer includes, but not limited to, silicon oxide; the top electrode may be formed by stacking titanium nitride and metallic nickel. A method for manufacturing the memory diode is given in the following and includes following steps:
  a) providing a germanium substrate, and forming an isolation layer on a surface of the germanium substrate;
  b) performing photolithography on the formed isolation layer, and performing etching by a chemical wet etching method to an upper surface of the germanium substrate;
  c) forming a memory layer germanium oxide/aluminum oxide/hafnium oxide structure on the germanium substrate after etching;
  d) forming a top electrode titanium nitride/nickel on the memory layer.

Figure 3:
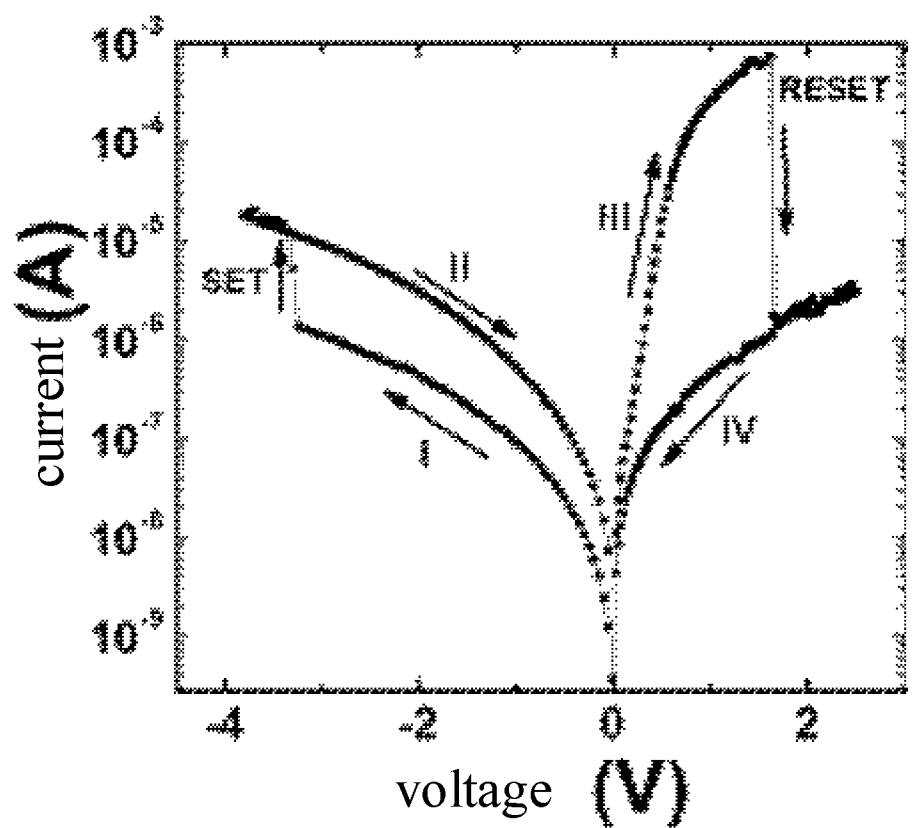
FIG. 3 is a current-voltage characteristic diagram of a memory diode according to the present disclosure.

FIG. 3 is a current-voltage characteristic diagram of a memory diode according to the present disclosure. In an operation state of the memory diode, a bottom electrode thereof is connected to ground, and a corresponding voltage is applied to a top electrode thereof, so as to achieve transition between an off-state (states I and IV in the drawing) and an on-state (states II and III in the drawing) of the memory diode. Specifically: resistance of the memory diode in the off-state suddenly decreases after being applied with a negative voltage, this process is referred to as SET, the memory diode changes from the off-state to the on-state, and it can be regarded as a diode device; the resistance of the memory diode in the on-state suddenly increases after being applied with a positive voltage, this process is referred to as RESET, the memory diode changes from the on-state to the off-state, and it can be regarded as a resistor having high resistance.

When a read voltage with a same magnitude is applied to the memory diode in the on-state, a current in the state III is larger than twice of a current in the state II; when a same read voltage is applied to the memory diodes in the on-state and the off-state respectively, the current in the on-state is larger than twice of the current in the off-state.

Figure 4:
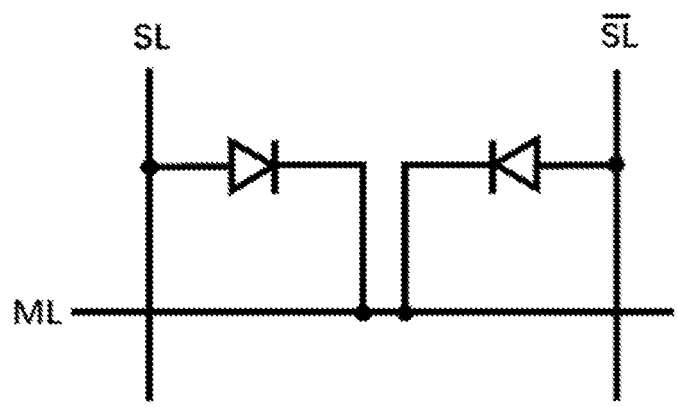
FIG. 4 is a circuit schematic diagram of a kernel unit according to the present disclosure.

FIG. 4 is a circuit schematic diagram of a kernel unit according to the present disclosure. Each kernel unit includes a first memory diode and a second memory diode. The top electrodes of the first memory diode and the second memory diode are respectively connected to a pair of complementary search signal lines, and the bottom electrodes of the first memory diode and the second memory diode are connected to a same matching line. A material of the matching line is germanium, and the search signal line is a metal line connected to the top electrode of the diode.

Figures 5, 6:
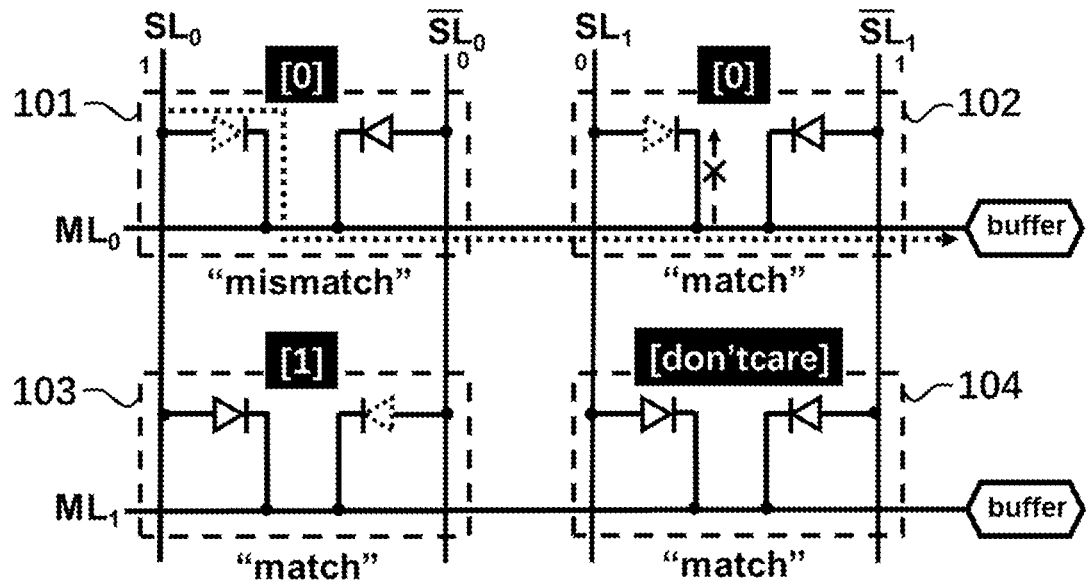
FIG. 5 is a circuit schematic diagram illustrating four types of data matching results obtained according to an embodiment of the present disclosure.
FIG. 6 is a diagram illustrating a matching result obtained according to an embodiment of the present disclosure.

FIG. 5 is a circuit schematic diagram illustrating four types of data matching results obtained according to an embodiment of the present disclosure. The first memory diode and the second memory diode in the kernel unit cooperate with each other to store three logic states of [0], [1], and [don't care]: when the first memory diode is in the on-state and the second memory diode is in the off-state, the kernel unit stores a data bit [0]; when the first memory diode is in the off-state and the second memory diode is in the on-state, the kernel unit stores a data bit [1]; when both the first memory diode and the second memory diode are in the off-state, the kernel unit is in a state of [don't care].

When the data bit stored in the kernel unit is consistent with the search signal, it is in a match state (match), and when all kernel units on a same matching line are in the match state (match), the matching line outputs [0]; when the data bit stored in the kernel unit is inconsistent with the search signal, it is in a mismatch state (mismatch), and when one or more kernel units on a same matching line is in the mismatch state (mismatch), the matching line outputs [1].

As shown in FIG. 5, a 101 kernel unit is in the mismatch state (mismatch), the kernel unit stores the data bit [0], the search signal is [1], and a current flows smoothly through the on-state memory diode in the kernel unit, so that the matching line ($ML_0$) has its voltage increased and outputs [1]; a 102 kernel unit is in the match state (match), the kernel unit stores the data bit [0], the search signal is [0], and since the on-state memory diode in the kernel unit has diode characteristics, a mismatch current caused by the 101 kernel unit cannot flow through this on-state memory diode, thereby maintaining the voltage of the same matching line ($ML_0$); a 103 kernel unit is in the match state (match), the kernel unit stores the data bit [1], and the search signal is [1], which does not affect a voltage of the matching line ($ML_1$); a 104 kernel unit is in the match state (match), the kernel unit stores [don't care], and the search signal is [1], which does not affect the voltage of the matching line ($ML_1$), and [0] is outputted.

FIG. 6 is a diagram illustrating a matching result obtained according to an embodiment of the present disclosure. In this embodiment, the ternary content addressable memory stores a total of 8 words, which are expressed in hexadecimal as FF, 00, A5, 5A, AX, X5, FX, X0. The search signal is expressed in hexadecimal as FF. It can be seen from this table that when the search signal and the stored data match each other, an output voltage on the corresponding matching line is very low, whereas when the search signal and the stored data do not match each other, an output voltage on the corresponding matching line is relatively high.

What is claimed is:

1. A memory diode, comprising a bottom electrode, an isolation layer, a memory layer, and a top electrode that are stacked from bottom to top, wherein the memory layer is formed by stacking germanium oxide, aluminum oxide, and hafnium oxide from bottom to top, and the bottom electrode is made of germanium, wherein the memory diode is in an on state after a negative SET voltage is applied to the top electrode, the memory diode is in an off state after a positive RESET voltage is applied to the top electrode, and wherein the on state is a low-resistance state, and the off state is a high-resistance state.

2. The memory diode according to claim 1, wherein in an operation state of the memory diode, the bottom electrode of the memory diode is connected to ground, and the negative voltage or the positive voltage is applied to the top electrode of the memory diode, so as to achieve transition between the off-state and the on-state of the memory diode.

3. The memory diode according to claim 2, wherein resistance of the memory diode in the off-state suddenly decreases after being applied with the negative voltage, this process is referred to as SET, the memory diode changes from the off-state to the on-state and is regarded as a diode device; and the resistance of the memory diode in the on-state suddenly increases after being applied with the positive voltage, this process is referred to as RESET, the memory diode changes from the on-state to the off-state and is regarded as a resistor having high resistance.

4. The memory diode according to claim 1, wherein the top electrode is a stacking of titanium nitride and nickel.

5. The memory diode according to claim 4, wherein the germanium oxide is in direct contact with the aluminum oxide, the aluminum oxide is in direct contact with the hafnium oxide, and the hafnium oxide is in direct contact with the titanium nitride.

6. The memory diode according to claim 1, wherein when the memory diode is in the on state, a current of the memory diode when a first read voltage is applied is greater than twice of a current of the memory diode when a second read voltage is applied, the first read voltage is a positive voltage, the second read voltage is a negative voltage, and the first read voltage and the second read voltage have a same magnitude.

7. The memory diode according to claim 1, wherein when a same read voltage is applied, a current of the memory diode is in the on state is twice of a current of the memory diode in the off state.

* * * * *